(12) United States Patent
Cai

(10) Patent No.: US 9,638,974 B2
(45) Date of Patent: May 2, 2017

(54) ARRAY SUBSTRATE, MANUFACTURE METHOD THEREOF, AND DISPLAY DEVICE

(71) Applicants: BOE Technology Group Co., Ltd., Beijing (CN); Hefei Xinsheng Optoelectronics Technology Co., Ltd., Hefei (CN)

(72) Inventor: Zhenfei Cai, Beijing (CN)

(73) Assignees: BOE Technology Group Co., Ltd., Beijing (CN); Hefei Xinsheng Optoelectronics Technology Co., Ltd., Hefei (CN)

( * ) Notice: Subject to any disclaimer, the term of this patent is extended or adjusted under 35 U.S.C. 154(b) by 0 days.

(21) Appl. No.: 15/191,889

(22) Filed: Jun. 24, 2016

(65) Prior Publication Data

US 2016/0377945 A1 Dec. 29, 2016

(30) Foreign Application Priority Data

Jun. 25, 2015 (CN) .......................... 2015 1 0359215

(51) Int. Cl.
| | | |
|---|---|---|
| *H01L 27/14* | (2006.01) | |
| *G02F 1/1362* | (2006.01) | |
| *G02F 1/1343* | (2006.01) | |
| *H01L 27/12* | (2006.01) | |

(52) U.S. Cl.
CPC .... *G02F 1/136286* (2013.01); *G02F 1/13439* (2013.01); *G02F 1/13624* (2013.01); *G02F 1/134309* (2013.01); *G02F 1/136213* (2013.01); *G02F 1/136227* (2013.01); *H01L 27/124* (2013.01); *H01L 27/1288* (2013.01); *G02F 2001/134318* (2013.01); *G02F 2001/136295* (2013.01); *G02F 2201/121* (2013.01); *G02F 2201/123* (2013.01)

(58) Field of Classification Search
CPC ............... H01L 27/124; H01L 27/1288; G01F 1/136286; G02F 1/134309; G02F 1/13439; G02F 1/136213; G02F 1/136227; G02F 2001/134318; G02F 2001/136295; G02F 2201/121; G02F 2201/123

See application file for complete search history.

(56) References Cited

U.S. PATENT DOCUMENTS

| | | | | |
|---|---|---|---|---|
| 6,320,221 B1* | 11/2001 | Choi | ...................... | G02F 1/1368 257/329 |
| 6,664,569 B2* | 12/2003 | Moon | .................... | G02F 1/1368 257/249 |
| 2009/0231522 A1* | 9/2009 | Kim | ..................... | G02F 1/13394 349/106 |
| 2012/0033149 A1* | 2/2012 | Song | ................. | G02F 1/134363 349/42 |

* cited by examiner

*Primary Examiner* — Yosef Gebreyesus
(74) *Attorney, Agent, or Firm* — Banner & Witcoff, Ltd.

(57) ABSTRACT

An array substrate, a manufacture method thereof and a display device are provided. The array substrate includes: gate lines and data lines which are crossed to define a plurality of pixel units; and common electrode lines intersected with the data lines, the pixel units being provided with pixel electrodes; wherein, the common electrode lines are provided with first protrusions electrically connected to the common electrode lines; the gate lines are provided with first grooves; the first protrusions are disposed in the first grooves; and the pixel electrodes are overlapped with corresponding first protrusions.

19 Claims, 7 Drawing Sheets

ARRAY SUBSTRATE, MANUFACTURE METHOD THEREOF, AND DISPLAY DEVICE

This application claims priority to and the benefit of Chinese Patent Application No. 201510359215.7 filed on Jun. 25, 2015, which application is incorporated herein in its entirety.

TECHNICAL FIELD

Embodiments of the present invention relate to an array substrate, a manufacture method thereof, and a display device.

BACKGROUND

As a flat-panel display device, Thin Film Transistor Liquid Crystal Display (TFT-LCD) has been more and more commonly applied in technical field of high-performance display for its characteristics such as small volume, low power consumption, no radiation and relatively low manufacture cost.

The basic principle for TFT-LCD to achieve image display of frames is to input square waves with a certain width into rows of pixel units from top to bottom through gate lines so as to gating the pixel units, and then charge storage capacitances of the pixel units having been gated through data lines. A deflection angle maintained by liquid crystal molecules in a certain time period is controlled by the storage capacitances, thereby achieving control of light intensity.

However, an excessively smaller storage capacitance in the display device may result in a brightness of the pixel units during a voltage holding stage failing to reach a designed value, which leads to display failure.

SUMMARY

Embodiments of the present invention provide an array substrate, a manufacture method thereof, and a display device.

Embodiments of the present invention utilize technical solutions as below.

In one aspect, embodiments of the present invention provide an array substrate, comprising: gate lines and data lines which are crossed to define a plurality of pixel units; and common electrode lines intersected with the data lines, the pixel units being provided with pixel electrodes; wherein, the common electrode lines are provided with first protrusions electrically connected to the common electrode lines; the gate lines are provided with first grooves; the first protrusions are disposed in the first grooves; and the pixel electrodes are overlapped with corresponding first protrusions.

In another aspect, embodiments of the present invention provide a display device comprising any of the above array substrates.

In yet another aspect, embodiments of the present invention provide a manufacture method of array substrate, comprising: forming patterns of gate lines and patterns of common electrode lines on a base substrate, wherein the patterns of gate lines are provided with first grooves, the patterns of common electrode lines are provided with first protrusions electrically connected to the patterns of common electrode lines; wherein the first protrusions are disposed in the first grooves; forming patterns of data lines on the base substrate, wherein the patterns of data lines and the patterns of gate lines are laterally and longitudinally intersected to define a plurality of pixel units; and forming patterns of pixel electrodes in the pixel units, wherein the patterns of pixel electrodes are overlapped with corresponding first protrusion.

BRIEF DESCRIPTION OF THE DRAWINGS

In order to clearly illustrate the technical solution of the embodiments of the present invention, the drawings of the embodiments will be briefly described in the following, wherein.

FIG. 1b is a cross-sectional view taken along A-A' in FIG. 1a;

FIG. 5 is a flow chart illustrating a manufacture method of the array substrate as illustrated in FIG. 1a;

DETAILED DESCRIPTION

In order to make objects, technical solutions and advantages of the embodiments of the present invention apparent, the technical solutions of the embodiment will be described in a clearly and fully understandable way in connection with the drawings related to the embodiments of the present invention. It is obvious that the described embodiments are just a part but not all of the embodiments of the present invention. Based on the described embodiments herein, those skilled in the art can obtain other embodiment(s), without any inventive work, which should be within the scope of the present invention.

Unless otherwise defined, all the technical and scientific terms used herein have the same meanings as commonly understood by one of ordinary skill in the art to which the present invention belongs. The terms, such as "first," "second," or the like, which are used in the description and the claims of the present application, are not intended to indicate any sequence, amount or importance, but for distinguishing various components. Also, the terms, such as "a/an," "one," or the like, are not intended to limit the amount, but for indicating the existence of at lease one. The terms, such as "comprise/comprising," "include/including," or the like are intended to specify that the elements or the objects stated before these terms encompass the elements or the objects and equivalents thereof listed after these terms, but not preclude other elements or objects. The terms, "on," "under," or the like are only used to indicate relative position relationship, and when the position of the object which is described is changed, the relative position relationship may be changed accordingly.

First Embodiment

Figure 1A:
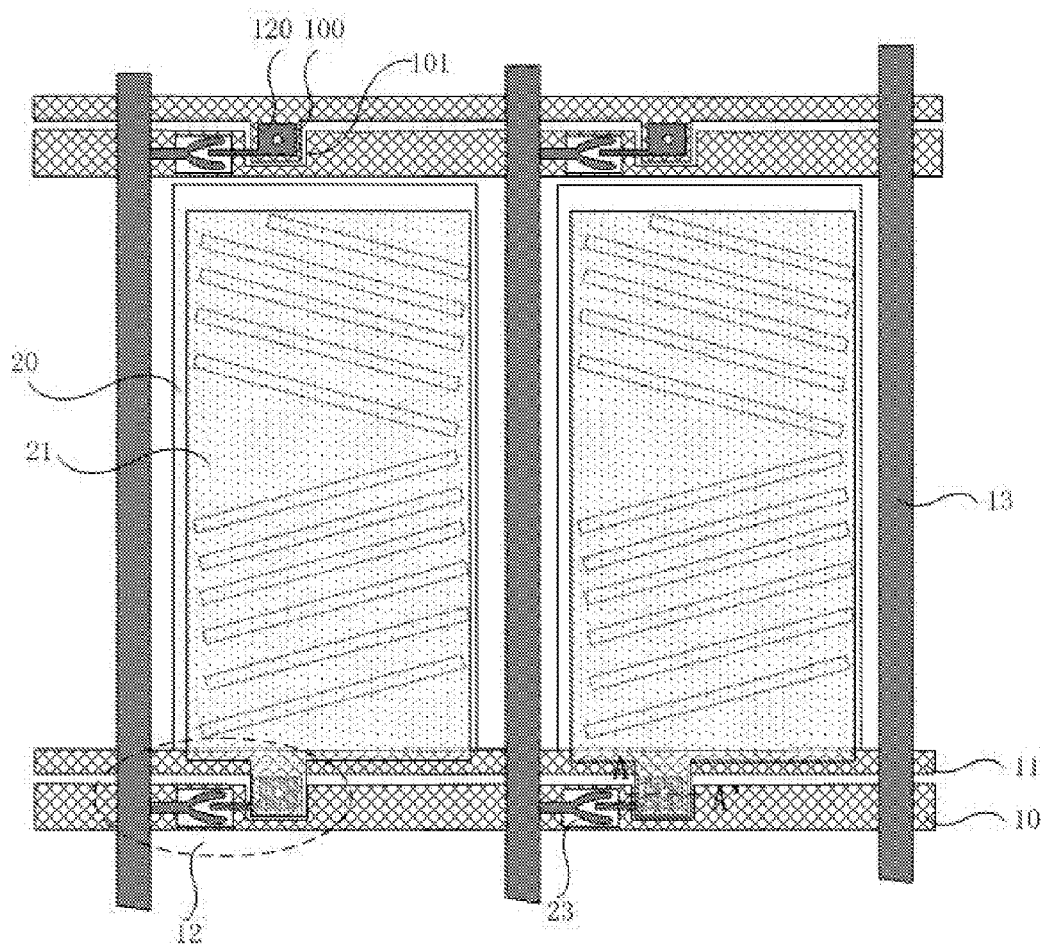
FIG. 1a is a schematically structural diagram illustrating an array substrate provided by an embodiment of the present invention.

An embodiment of the present invention provides an array substrate. As illustrated in FIG. 1a, the array substrate includes: gate lines 10 and data lines 13 which are intersected laterally and longitudinally to define a plurality of pixel units; and common electrode lines 11 intersected with the data lines 13. Each of the pixel units is provided with a pixel electrode 21. Wherein, first protrusions 100 electrically connected to the common electrode lines 11 are formed on the common electrode lines 11; first grooves 101 are formed on the gate lines 10; the first protrusions 100 are disposed within the first grooves 101; and the pixel electrodes 21 are overlapped with the first protrusions 100.

It should be noted that, firstly, in order to enlarge storage capacitors formed by common electrodes 20 and the pixel electrodes 21, the pixel electrodes 21 can completely cover the first protrusions 100. In addition, when the array substrate includes TFTs 12, positions of drain electrodes 120 of the TFTs can correspond to positions of the first protrusions 100, so that both the first protrusions 100 and the drain electrodes 120 of the TFTs are disposed in the first grooves 101, and the first grooves 101 are disposed outside Active Areas (AA for short), thus the structure also can increase an aperture ratio.

Secondly, the common electrode lines 11 are connected to the common electrodes 20 for inputting common voltage signals Vcom to the common electrodes 20. The drain electrodes 120 of the TFTs are connected to the pixel electrodes 21 for charging the storage capacitors formed by the common electrodes 20 and the pixel electrodes 21 when the data lines 13 input data signals Vdata to the pixel electrodes 21 through source electrodes 121 and the drain electrodes 120 of the TFTs.

In one example, a material for forming the common electrodes 20 and the pixel electrodes 21 can be a transparent conductive material, e.g., Indium Tin Oxide (ITO). Moreover, one of the common electrode 20 and the pixel electrode 21 can be of a slit shape, and the other one of the common electrode 20 and the pixel electrode 21 can be of a slit shape or a planar shape. In this way, an array substrate of an Advanced-Super Dimensional Switching (AD-SDS, ADS for short) type display device can be formed. By adopting AD-SDS technology, a multi-dimensional electric field can be formed by parallel electric fields generated by edges of slit-shaped electrode layers (e.g., the common electrodes 20) in the same plane and longitudinal electric fields each generated by two electrode layers disposed on different layers, so that all oriented liquid crystal molecules between and above the pixel electrodes in a liquid crystal cell can generate rotary conversion, thereby improving working efficiency of plane-oriented liquid crystals and also increasing transmittance efficiency.

According to embodiments of the present invention, an upper and lower layer relationship between the common electrodes 20 and the pixel electrodes 21 is not limited, but only defining the electrode layers close to the base substrate as lower electrode layers and defining the electrode layers far away from the base substrate as upper electrode layers; and the base substrate can be a transparent substrate, e.g. a glass substrate or a substrate made of transparent resin.

In addition, according to the embodiments of the present invention, the type of the TFTs is not particularly limited but can be top-gate TFTs or bottom-gate TFTs. When bottom-gate TFTs are utilized, it's usually to form gate electrodes of the TFTs on the base substrate firstly, and then source electrodes 121 and the drain electrodes 120. The common electrode lines 11 are generally made of metal with high electrical conductivity, thus in order to improve manufacture efficiency, the common electrode lines 11 and the gate lines 10 can be made of the same material in a single patterning process.

In this case, since the common electrode lines 11 are relatively close to the base substrate, in order to enable the common electrode lines 11 and the common electrodes 20 to have excellent contact characteristic, the common electrode lines 11 can be disposed on one side close to the base substrate so as to be used as the lower electrode layers of the ADS display device, while the pixel electrodes 21 can be used as the upper electrode layers. Of course, when the common electrode lines 11 are used as the upper electrode layers, the pixel electrodes 21 need to be electrically connected to the common electrode lines 11 close to the base substrate through the via holes.

Figure 1B:
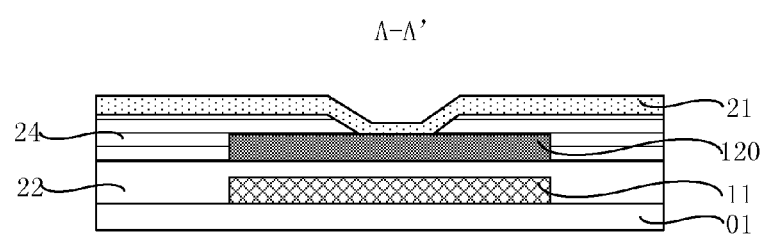

Although the embodiments of the present invention are not intended to limit the upper and lower layer relationship between the common electrodes 20 and the pixel electrodes 21, in order for convenience of illustration, embodiments as below are described with the common electrodes 20 used as the slit-shaped lower electrode layers and the pixel electrodes 21 used as the plane-shaped upper electrode layers by way of example. In this case, a sectional view taken along a dashed line A-A' in FIG. 1a is illustrated in FIG. 1b. It can be seen from FIG. 1b that the common electrode lines 11 are disposed at a lower layer and are close to the base substrate 01, and the pixel electrodes 21 are disposed at an uppermost layer and are connected to the drain electrodes 120 through via holes. In addition, the array substrate further includes other thin film layers, e.g., gate insulating layers 22 disposed on surfaces of the gate lines 10 as illustrated in FIG. 1b, semiconductor active layers 23 disposed between the source and drain electrodes and the gate electrodes 21 of TFTs 12 as illustrated in FIG. 1a, passivation layers 24 disposed between the pixel electrodes 21 and the source and drain electrodes of the TFTs 12 as illustrated in FIG. 1b, and the like, without particularly described in details herein.

Thirdly, a correspondence between the positions of the drain electrodes 120 of the TFTs 12 and the positions of the first protrusions 100 refers to that, as illustrated in FIG. 1, a region where the drain electrodes 120 of the TFTs 12 are disposed is completely disposed in a region where the first protrusions 100 are disposed; in this way, the drain electrodes 120 of the TFTs 12 are disposed in the first grooves 101 as well.

Fourthly, in order to simplify the manufacture process, the first protrusions 100 electrically connected to the common electrode lines 11 can be disposed integrally with the common electrode lines 11 so as to be formed in a single patterning process.

Fifthly, in the embodiments of the present invention, the patterning process can include photoetching process and etching process, and further can include other processes for forming predetermined patterns such as printing and ink jetting; and the photoetching process includes technical processes such as film formation, exposure and development. It's possible to select corresponding patterning processes according to the structures as formed, e.g., processes capable of forming patterns by utilizing photoresist, mask and exposure machine.

The array substrate provided by the embodiment of the present invention includes: gate lines and data lines which are laterally and longitudinally intersected to define a plurality of pixel units; and common electrode lines intersected with the data lines. The pixel units are provided with pixel electrodes; the common electrode lines are provided with first protrusions electrically connected thereto; the gate lines are provided with first grooves; the first protrusions are disposed in the first grooves; and the pixel electrodes are overlapped with the first protrusions. For display panels with the same transmittance, the first protrusions are connected to the common electrodes by the common electrode lines, thus areas of lower polar plates of the storage capacitances of the pixel units in the array substrate can be enlarged by the first protrusions; moreover, the pixel electrodes are overlapped with the first protrusions, thus areas of the pixel electrodes are also increased so that the areas of the lower polar plates of the storage capacitances are enlarged. In this way, as a result of the increase of the areas of both upper and lower polar plates of the storage capacitors, the storage capacitors are enlarged, thus avoiding the problem that the brightness of the pixel units cannot reach a designed value at the voltage holding stage due to excessively low storage capacitances in the display device.

As it can be seen from the above description, the common electrode lines 11 can provide the common electrodes 20 with common voltage signals Vcom; and as a result of the parallel arrangement of the common electrode lines 11 and the gate lines 10, the common electrodes 20 of pixel units (defined by gate lines 10 and data lines 13 which are laterally and longitudinally intersected) disposed in a same row can be connected one another by a single common electrode line 11. However, the common electrodes 20 of the pixel units disposed in a same column along the data line direction are not communicated, which results in a phenomenon of uneven common voltage signals Vcom among the pixel units of the entire array substrate. In order to solve such problem, the present invention further provides embodiments as below.

Second Embodiment

Figure 2:
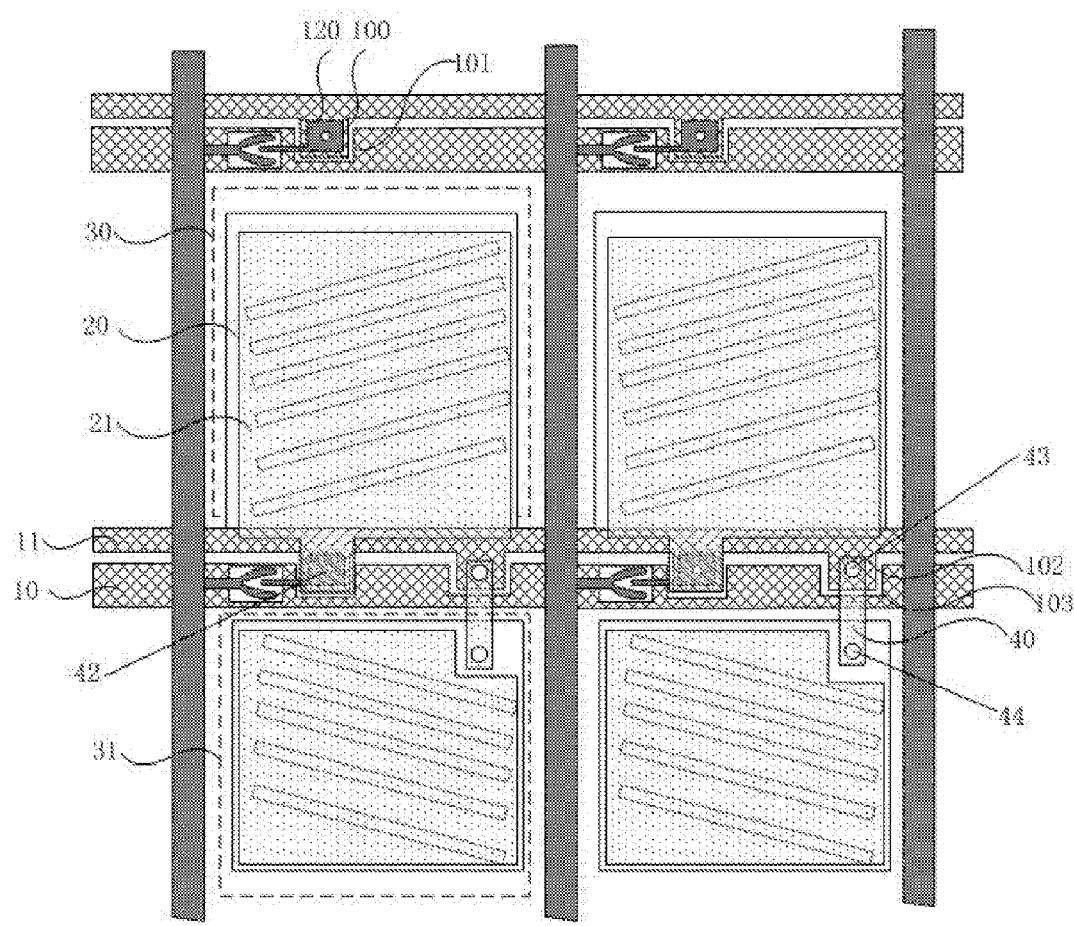
FIG. 2 is a schematically structural diagram illustrating another array substrate provided by an embodiment of the present invention.

An array substrate provided by another embodiment of the present invention is as illustrated in FIG. 2, wherein structures of first grooves 101 on gate lines 10 and first protrusions 100 on common electrode lines 11 are the same with those in the first embodiment, thus will not be illustrated in details herein.

In the embodiment, the pixel units can include first pixel units 30 and second pixel units 31 which are adjacent and are connected to the same data lines 13. It should be explained that, in the embodiment of the present invention, respective pixel units are identical in structure, and only for convenience of illustrating connection relationships between every two adjacent pixel units, the pixel units are partitioned into the first pixel units 30 and the second pixel units 31.

Different from the first embodiment, in this embodiment, the common electrode lines 11 in the first pixel units 30 are further provided with second protrusions 102 electrically connected thereto; and the gate lines 10 in the first pixel units 30 are further provided with second grooves 103. The second protrusions 102 are disposed in the second grooves 103.

In the embodiment, the second protrusions 102 on the common electrode lines 11 in the first pixel units 30 are electrically connected to the common electrodes 20 in the second pixel units 31. In order to simply the manufacture process, in one example, the second protrusions 102 electrically connected to the common electrode lines 11 can be arranged integrally with the common electrode lines 11 so as to be formed in a single patterning process.

In one example, electrical connections between the second protrusions 102 on the common electrode lines 11 in the first pixel units 30 and the common electrodes 20 in the second pixel units 31 can be achieved in ways as follows: via holes can be formed at positions in the first pixel units 30 corresponding to the second protrusions 102 and positions in the second pixel units 31 corresponding to the common electrodes 20, and transparent electrical connecting lines 40 are respectively in direct contact with the first protrusions 102 in the first pixel units 30 and the common electrodes 20 in the second pixel units 31 through the via holes, wherein the transparent electrical connecting lines 40 can be made of a transparent conductive material, e.g., ITO. In order to simplify the manufacture process and reduce manufacture cost, the electrical connecting layers 40 can be prepared by a single patterning process in which the pixel electrode layers 21 are prepared, i.e., the pixel electrode layers 21 and the electrical connecting layers 40 are located at the same layer and made of the same material, wherein patterns of the electrical connecting layers 40 and patterns of the pixel electrode layers 21 need to be disconnected. Of course, the pixel electrode layers 21 and the electrical connecting layers 40 also can be respectively formed by two separate patterning processes; in this case, the pixel electrode layers 21 and the electrical connecting layers 40 can be made of different materials, e.g., the pixel electrode layers 21 are made of ITO while the electrical connecting layers 40 are made of Indium Zinc Oxide (IZO), but the embodiments of the present invention are not limited thereto. It should be explained that, all the drawings of the present invention merely illustrate the case where the pixel electrode layers 21 and the electrical connecting layers 40 are formed at the same layer using the same material by way of example, but the embodiments of the present invention are not intended to be limited thereto.

According to the technical solution of the embodiment, the second protrusions 102 in the first pixel units 30 are electrically connected to the common electrode lines 11, while the common electrode lines 11 are in turn connected to the common electrodes 20 in the second pixel units 31. With such structure, electrical connections between the common electrodes 20 in the first pixel units 30 and the common electrodes 20 in the second pixel units 31 can be achieved, so that the common electrodes 20 in the pixel units disposed in a same column along the data line direction are communicated, thus the phenomenon of uneven common voltage signals Vcom among the pixel units of the array substrate is avoided.

Third Embodiment

Figure 3:
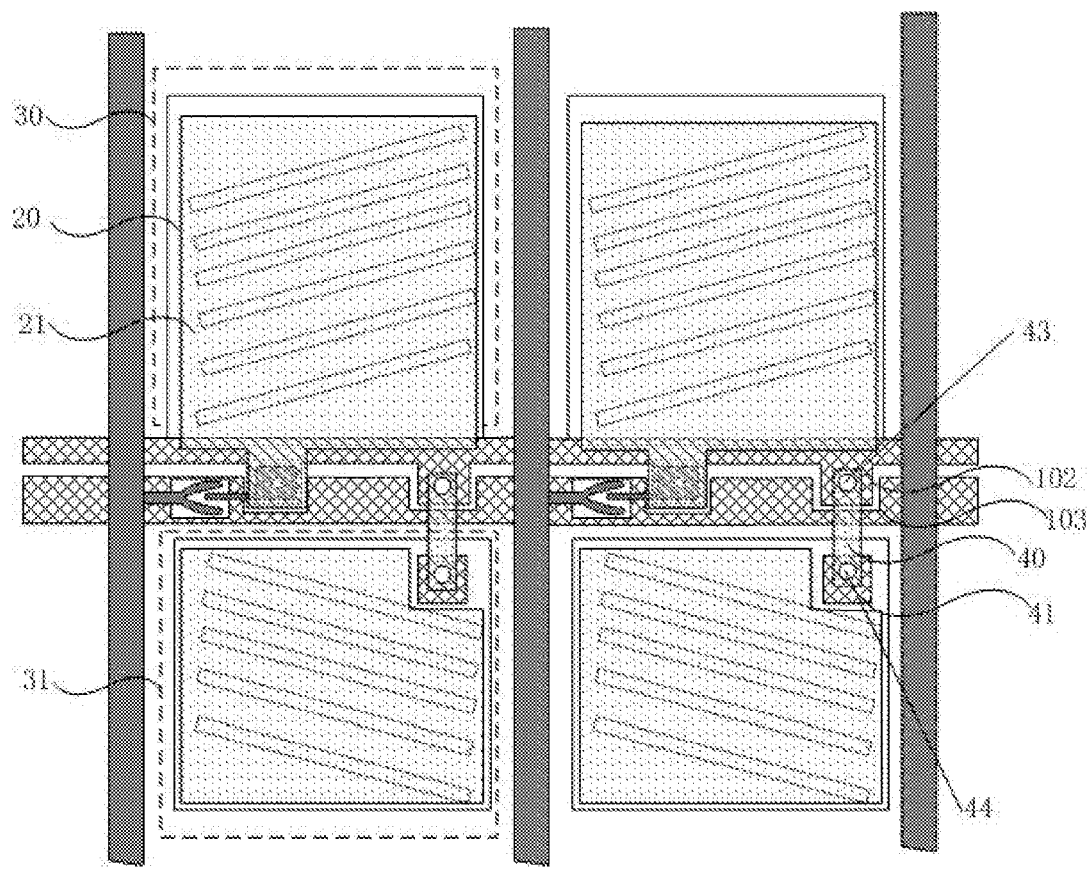
FIG. 3 is a schematically structural diagram illustrating yet another array substrate provided by an embodiment of the present invention.

An array substrate provided by another embodiment of the present invention is as illustrated in FIG. 3. Different from the second embodiment, electrical connections between second protrusions 102 in first pixel units 30 and common electrodes 20 in second pixel units 31 in the present embodiment are achieved in such a manner that conductive blocks 41 as illustrated in FIG. 3 are disposed in the second pixel units 31, the conductive blocks 41 are connected to the common electrodes 20 in the second pixel units 31, and transparent electrical connecting lines 40 are in direct contact with the second protrusions 102 and the conductive blocks 41, wherein the first pixel units 30 and the second pixel units 31 are the same as those illustrated in the first embodiment, and will not be particularly described herein.

In one example of the embodiment, the conductive blocks 41 can be made of the same material with common electrode lines 11, and can be prepared by a single patterning process in which the common electrode lines 11 are prepared. In this case, via holes can be formed at positions in the first pixel units 30 corresponding to the second protrusions 102 and positions in the second pixel units 31 corresponding to the conductive blocks 41, and transparent electrical connecting lines 40 are respectively in direct contact with the second protrusions 102 in the first pixel units 30 and the conductive blocks 41 in the second pixel units 31 through the via holes.

Compared with the second embodiment, the conductive blocks 41 in the present embodiment can be made of metal, e.g., the conductive blocks 41 can be made of the same metal material with the common electrode lines 11 or the gate lines 10, thus the present embodiment can obtain higher electrical conductivity than that of the second embodiment. However, due to lightproof performance of the metal, arrangement of the conductive blocks 41 in the second pixel units 31 may result in reduction of an aperture ratio of the pixel units.

Fourth Embodiment

Figure 4:
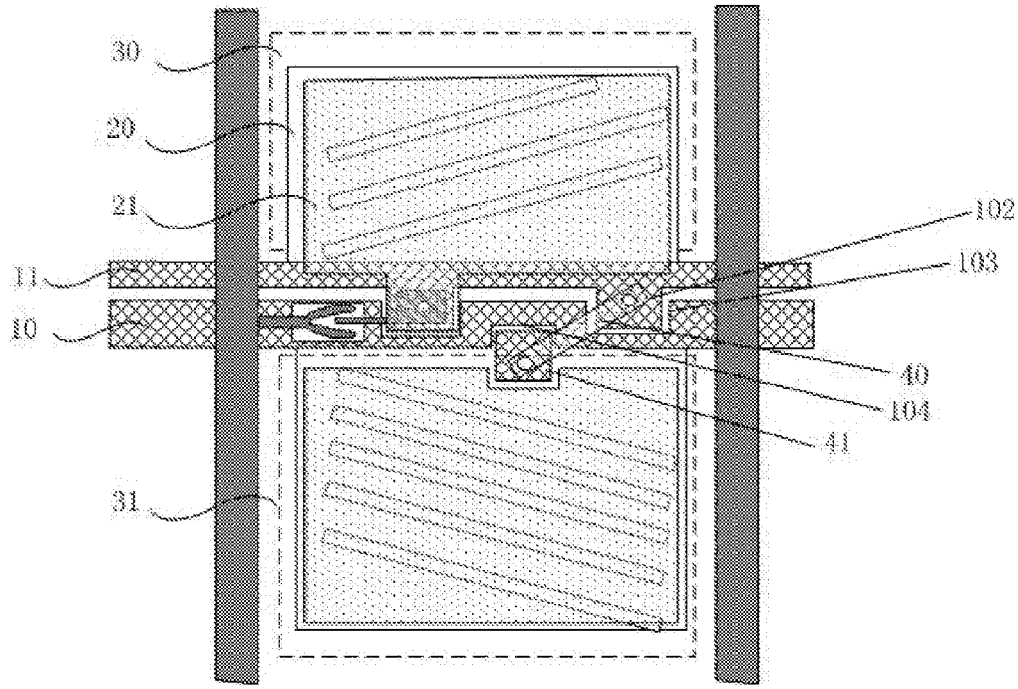
FIG. 4 is a schematically structural diagram illustrating still another array substrate provided by an embodiment of the present invention.

In order to solve the problem of small pixel aperture ratio in the third embodiment, another embodiment of the present invention provides an array substrate as illustrated in FIG. 4 in which first pixel units 30, second pixel units 31, second protrusions 102 and second grooves 103 are the same with those in the third embodiment and will not be described in details herein.

Different from the third embodiment, as illustrated in FIG. 4, gate lines 10 in the present embodiment are further provided with third grooves 104, wherein opening directions of the third grooves 104 are opposite to those of the first grooves 101 and the second grooves 103, and conductive blocks 41 are disposed in the third grooves 104. In this way, since the third grooves 104 are disposed outside active areas, the conductive blocks 41 disposed in the third grooves 104 can be partly or entirely disposed outside the active areas, so that the aperture ratio of the pixel units can be improved along with the electrical conductivity. However, as compared with the second embodiment and the third embodiment, since the gate lines 10 of the present embodiment are further provided with the third grooves 104, effective areas of the gate lines 10 are further decreased, which may influence the transmission capacity of the signals.

From the above, as compared with the first embodiment, the second to fourth embodiments can further eliminate the phenomenon of uneven common voltage signals Vcom among the pixel units. Moreover, as compared with the second embodiment, the third embodiment can improve the electrical conductivity, but correspondingly may cause decrease of aperture ratio of the pixel units; and as compared with the third embodiment, the fourth embodiment can improve the aperture ratio of the pixel units while ensuring electrical conductivity, but correspondingly may reduce the transmission capacity of the signals. Therefore, those skilled in the art can select specific embodiments to perform during the manufacture process according to actual requirements.

Fifth Embodiment

Under the same inventive concept, the embodiment of the present invention further provides a display device which includes the array substrate provided by any one of the above embodiments and correspondingly, also has the same advantageous effects with the array substrate provided by the above embodiments. The structure and advantageous effects of the array substrate have been illustrated in details in the above embodiments and will not be repeated herein.

It should be explained that, in the embodiment of the present invention, the display device can be any products or components with display function, e.g., liquid crystal display, liquid crystal television, digital photo frame, mobile phone or tablet personal computer and the like.

Sixth Embodiment

Figure 5:
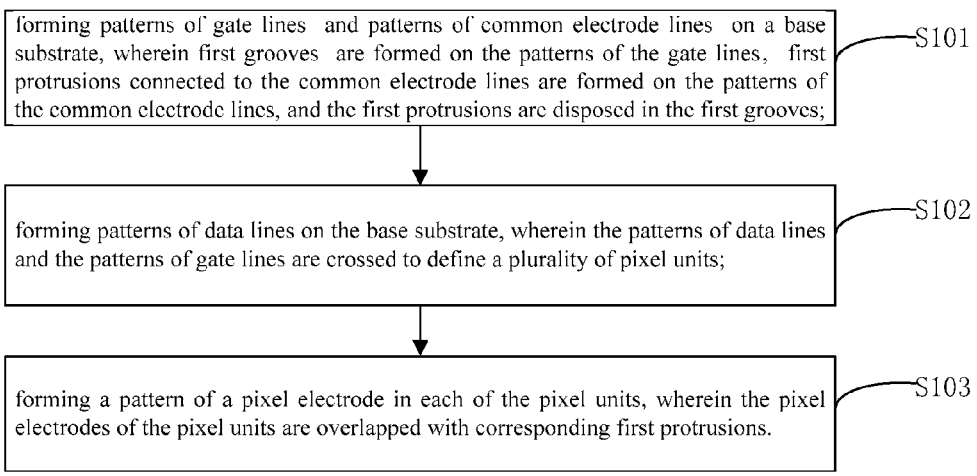

Under the same invention concept, the embodiment of the present invention further provides a manufacture method of an array substrate. As illustrated in FIG. 5, the method can include steps as below.

S101, forming patterns of gate lines 10 and patterns of common electrode lines 11 on a base substrate, wherein first grooves 101 as illustrated in FIG. 1a are formed on the patterns of the gate lines 10; first protrusions 100 connected to the common electrode lines 11 are formed on the patterns of the common electrode lines 11; and the first protrusions 100 are disposed in the first grooves 101.

S102, forming patterns of data lines 13 on the base substrate, wherein the patterns of data lines 13 and the patterns of gate lines 10 are intersected laterally and longitudinally to define a plurality of pixel units.

S103, forming a pattern of a pixel electrode 21 in each of the pixel units, wherein the pixel electrode 21 of the pixel units are overlapped with corresponding first protrusions 100.

It should be explained that, in order to enlarge the storage capacitors formed by the common electrodes 20 and the pixel electrodes 21, the pixel electrodes 21 can completely cover the corresponding first protrusions 100.

The manufacture method of array substrate provided by the embodiment of the present invention includes: forming patterns of gate lines and of common electrode lines on the base substrate, wherein first grooves are formed on the patterns of gate lines, first protrusions connected to the common electrode lines are formed on the patterns of common electrode lines, and the first protrusions are disposed in the first grooves; then forming the patterns of data lines on the base substrate, wherein the data lines and the gate lines are intersected laterally and longitudinally to define a plurality of pixel units; and finally forming the patterns of pixel electrodes in the pixel units, wherein the pixel electrodes are overlapped with corresponding first protrusions. For display panels with the same transmittance, the first protrusions are connected to the common electrodes by the common electrode lines, thus areas of lower polar plates of the storage capacitances of the pixel units in the array substrate can be enlarged by the first protrusions; moreover, the pixel electrodes are overlapped with the first protrusions, thus areas of the pixel electrodes are also increased so that the areas of the lower polar plates of the storage capacitances are enlarged, correspondingly. In this way, as a result of the increase of the areas of both upper and lower polar plates of the storage capacitors, the storage capacitors are enlarged, thereby avoiding the problem that the brightness of the pixel units cannot reach a designed value at the voltage holding stage due to excessively low storage capacitances in the display device.

As it can be seen from the above description, the common electrode lines 11 can provide the common electrodes 20 with common voltage signals Vcom; and as a result of the parallel arrangement of the common electrode lines 11 and the gate lines 10, the common electrodes 20 of pixel units (defined by gate lines 10 and data lines 13 which are laterally and longitudinally intersected) disposed in a same row can be connected one another by a single common electrode line 11. However, the common electrodes 20 of the pixel units disposed in a same column along the data line direction are not communicated, which results in a phenomenon of uneven common voltage signals Vcom among the pixel units of the entire array substrate. In order to solve such problem, the present invention further provides embodiments as below.

Seventh Embodiment

Figure 6:
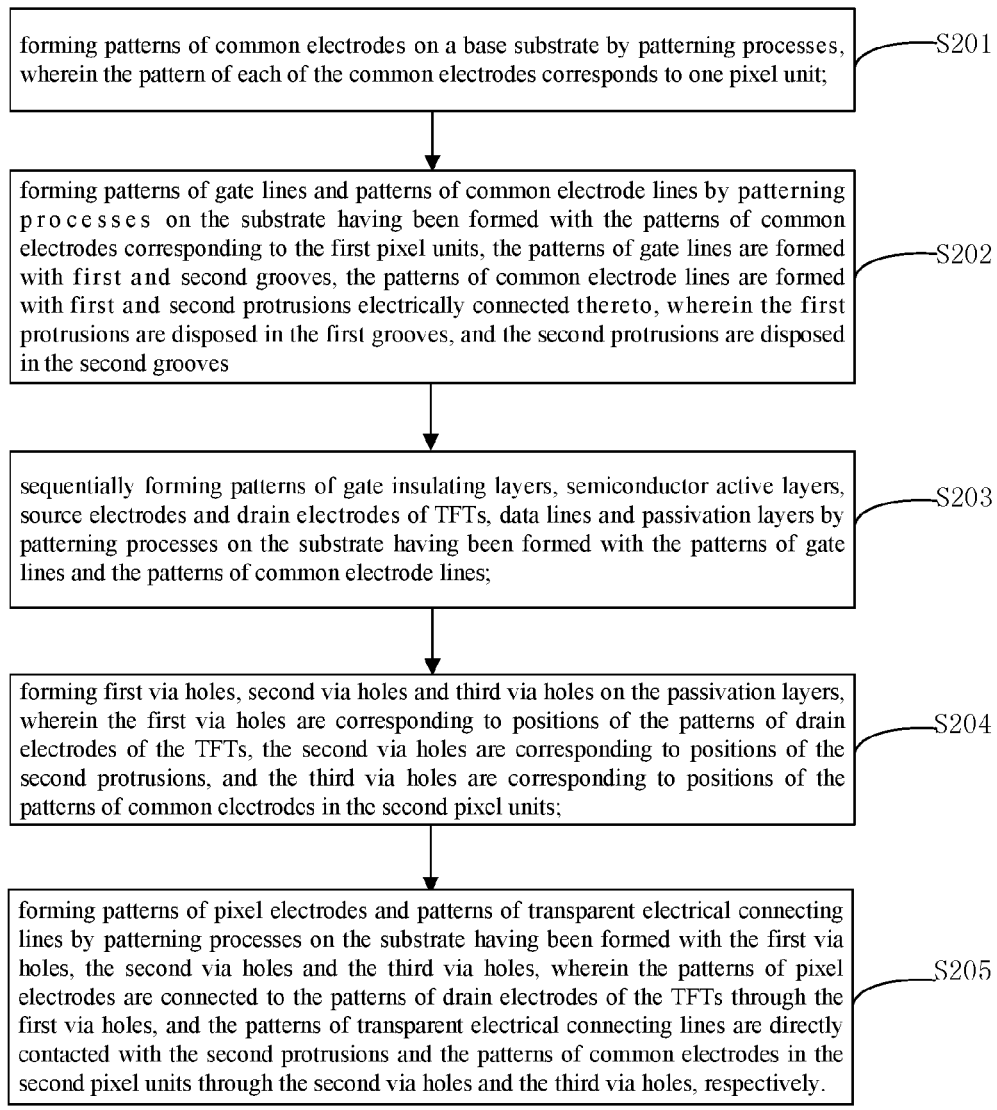
FIG. 6 is a flow chart illustrating a manufacture method of the array substrate as illustrated in FIG. 2.

Another embodiment of the present invention provides a manufacture method of array substrate as illustrated in FIG. 6, the method includes steps as below.

Figure 7A:
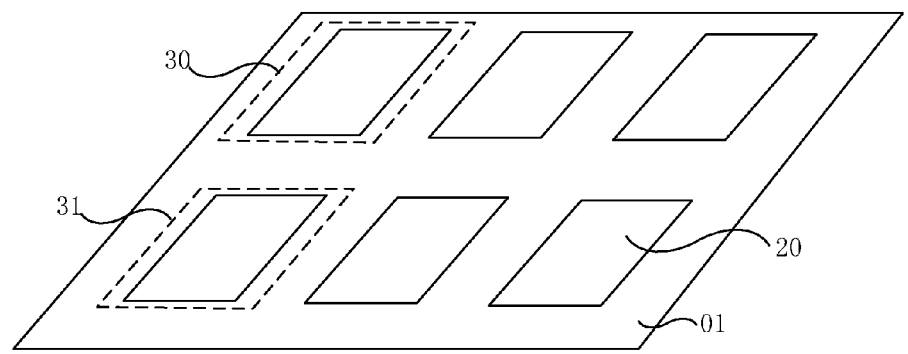
FIGS. 7a-7c are schematically structural diagrams corresponding to a step S201 in the flow chart of the manufacture method of array substrate as illustrated in FIG. 6.

S201, as illustrated in FIG. 7a, forming patterns of a plurality of common electrodes 20 on a base substrate 01 by a patterning process, wherein the pattern of each common electrode 20 corresponds to one pixel unit (e.g., first pixel units 30 and second pixel units 31).

When the common electrodes 20 are made of a transparent conductive material, e.g., ITO, the step S201 can further include: firstly, forming an ITO thin film on the base substrate 01 by processes such as coating and sputtering; then coating a layer of photoresist on the ITO thin film; subsequently, exposing the photoresist by a exposure process using a mask, so that the photoresist in active areas for display is not exposed while the photoresist outside the active areas is completely exposed; subsequently, developing the photoresist in completely exposed regions and etching the ITO thin film therein; finally, stripping the photoresist in the active areas so as to form the patterns of common electrodes 20 as illustrated in FIG. 7a.

Figure 7B:
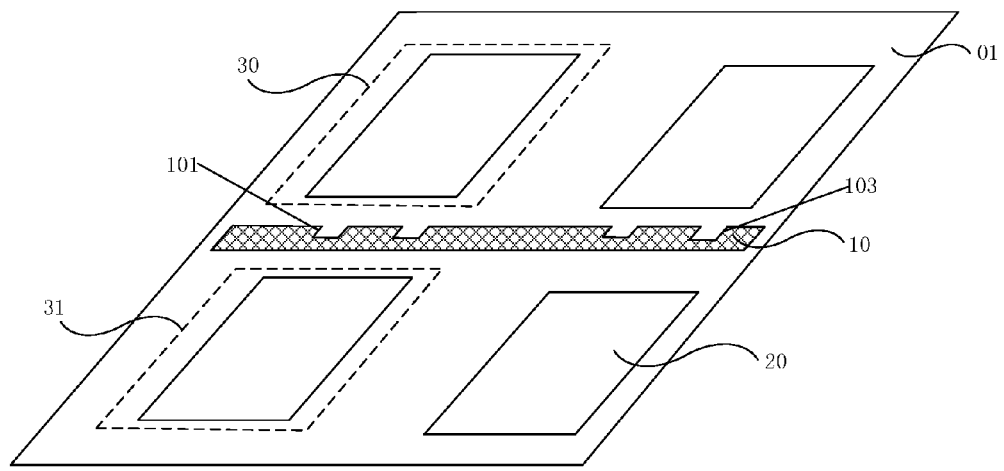
Figure 7C:
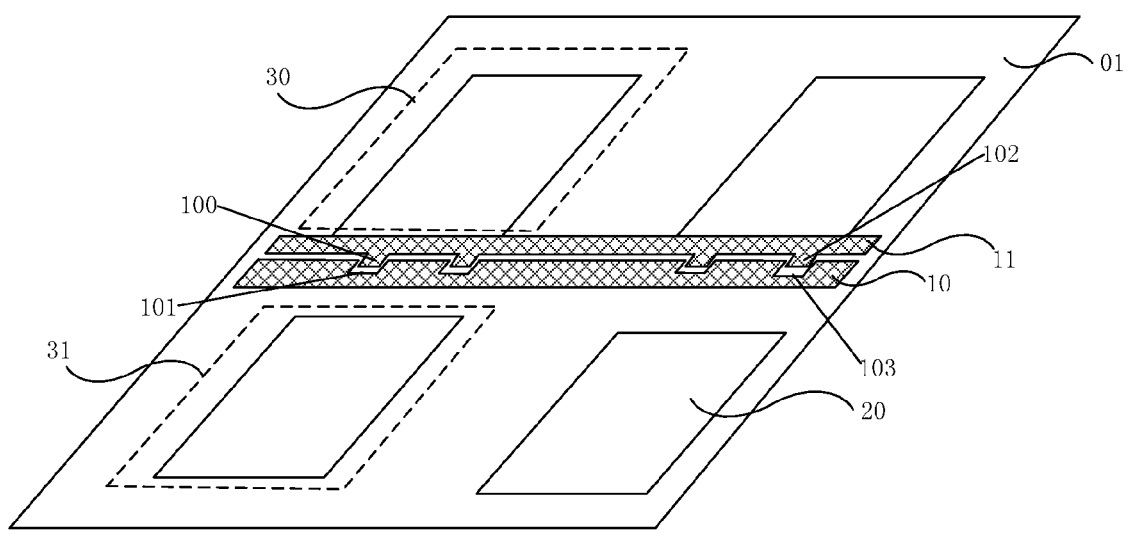

S202, on the substrate having been formed with the patterns of common electrodes 20 corresponding to the first pixel units 30, forming patterns of gate lines 10 and patterns of common electrode lines 11 by a patterning process; wherein as illustrated in FIG. 7b, first grooves 101 and second grooves 103 are formed on the patterns of gate lines 10; as illustrated in FIG. 7c, first protrusions 100 and second protrusions 102 electrically connected to the common electrode lines 11 are formed on the patterns of common electrode lines 11 in the first pixel units 30; wherein the first protrusions 100 are disposed in the first grooves 101, and the second protrusions 102 are disposed in the second grooves 103;

In this step, for the preparation of the gate lines 10 and the common electrode lines 11, reference can be made to the above-mentioned masking, exposing, developing and etching processes in the step S201.

S203, on the substrate having been formed with the gate lines 10 and the common electrode lines 11, sequentially forming: gate insulating layers 22 as illustrated in FIG. 1b, patterns of semiconductor active layers 23 as illustrated in FIG. 1a, patterns of source electrodes 121 and drain electrodes 120 of TFTs 12 as well as patterns of data lines 13 as illustrated in FIG. 2, and passivation layers 24 as illustrated in FIG. 1b, by patterning processes.

In this step, the positions of the drain electrodes 120 of the TFTs correspond to the positions of the first protrusions 100, so that both the first protrusions 100 and the drain electrodes 120 of the TFTs are disposed in the first grooves 101 while the first grooves 101 are disposed outside the active areas, thus the structure above also can reduce the aperture ratio.

In this step, for the preparation of respective thin film layers, reference can be made to the above-mentioned masking, exposing, developing and etching processes in the step S201.

S204, forming first via holes 42, second via holes 43 and third via holes 44 (refer to FIG. 2 and FIG. 3) on the passivation layers 24, wherein the first via holes 42 correspond to the positions of the drain electrodes 120 of the TFTs, the second via holes 43 correspond to positions of the second protrusions 102, and the third via holes 44 correspond to positions of the common electrodes 20 in the second pixel units 31.

S205, on the substrate having been formed with the first via holes 42, the second via holes 43 and the third via holes 44, forming patterns of pixel electrodes 21 and patterns of transparent electrical connecting lines 40 (refer to FIG. 2 and FIG. 3) by patterning processes. The pixel electrodes 21 are connected to the drain electrodes 120 of the TFTs through the first via holes 42; and the transparent electrical connecting lines 40 are respectively in direct contact with the second protrusions 102 and the common electrodes 20 in the second pixel units 31 through the second via holes 43 and the third via holes 44, respectively.

In this step, pixel electrodes 21 can be made of a transparent conductive material, e.g., ITO.

As above, the pixel electrodes 21 can be connected to the drain electrodes 120 of the TFT through the first via holes 42, so that data signals Vdata input by the data lines 13 can charge the pixel electrodes 21 by the source and drain electrodes of the TFTs. In addition, the second protrusions 102 are electrically connected to the common electrode lines 11 on rows where the first pixel units 30 are disposed, and the common electrode lines 11 are electrically connected to the common electrodes 20 in the first pixel units 30. In this way, the common electrodes 20 in the first pixel units 30 can be communicated with the common electrodes 20 in the second pixel units 31 so as to avoid the phenomenon of uneven common voltage signals Vcom.

Eighth Embodiment

Different from the seventh embodiment, electrical connections between second protrusions 102 in first pixel units 30 and common electrodes 20 in second pixel units 31 in the present embodiment are achieved in such a manner that conductive blocks 41 as illustrated in FIG. 3 are disposed in the second pixel units 31, the conductive blocks 41 are connected to the common electrodes 20 in the second pixel units 31, and transparent electrical connecting lines 40 are in direct contact with the second protrusions 102 and the conductive blocks 41.

The steps S201 to S203 in the seventh embodiment are also applicable to the present embodiment, and will not be described in details herein. Besides, the method in the present embodiment can further include:

Forming the conductive blocks 41 as illustrated in FIG. 3 in the second pixel units 31 while forming gate lines 10 and common electrode lines 11, wherein the conductive blocks 41 are in contact with the common electrodes 20 in the second pixel units 31;

Subsequently, forming first via holes 42, second via holes 43 and third via holes 44 on passivation layers 24, wherein the first via holes 42 correspond to the positions of drain electrodes 120 of TFTs, the second via holes 43 correspond to the positions of the second protrusions 102, and the third via holes 44 correspond to the positions of the conductive blocks 41;

Subsequently, on the substrate having been formed with the first via holes 42, the second via holes 43 and the third via holes 44, forming patterns of pixel electrodes 21 and patterns of transparent electrical connecting lines 40 by patterning processes. The pixel electrodes 21 are connected to the drain electrodes 120 of the TFTs through the first via holes 42; and the transparent electrical connecting lines 40 are respectively in direct contact with the second protrusions 102 and the conductive blocks 41 through the second via holes 43 and the third via holes 44, respectively.

The conductive blocks 41 in the present embodiment can be made of metal, e.g., the conductive blocks 41 can be made of the same metal material with the common electrode lines 11 or the gate lines 10, thus the present embodiment can obtain higher electrical conductivity than that of the seventh embodiment. However, due to lightproof performance of the metal, arrangement of the conductive blocks 41 in the second pixel units 31 may result in reduction of an aperture ratio of the pixel units.

In order to solve the problem of small pixel aperture ratio in the seventh embodiment, the present invention further provides embodiments as below.

Ninth Embodiment

The manufacture of thin film layers in the present embodiment are the same with those in the eighth embodiment and hence will be omitted herein. Hereinafter only the processes of forming gate lines 10 and conductive blocks 41 that are different from that in the eighth embodiment are described in details.

Firstly, on a substrate having been formed with patterns of common electrodes 20 corresponding to first pixel units 30, forming patterns of gate lines 10 by a patterning process; as illustrated in FIG. 4, forming first grooves 101, second grooves 103 and third grooves 104 on the patterns of gate lines 10, wherein opening directions of the third grooves 104 are opposite to those of the first grooves 101 and the second grooves 103.

Then, forming conductive blocks 41 disposed in the third grooves 104 by a patterning process.

As above, the third grooves 104 are disposed outside the active areas, thus the conductive blocks 41 disposed in the third grooves 104 can be partly or entirely disposed outside the active areas, so that the aperture ratio of the pixel units can be improved along with the electrical conductivity. However, as compared with the seventh embodiment and the eighth embodiment, since the gate lines 10 of the present embodiment are further provided with the third grooves 104, effective areas of the gate lines 10 are further decreased, which may influence the transmission capacity of the signals.

From the above, as compared with the sixth embodiment, the seventh to ninth embodiments can further eliminate the phenomenon of uneven common voltage signals Vcom among the pixel units. Moreover, as compared with the seventh embodiment, the eighth embodiment can improve the electrical conductivity, but correspondingly may cause decrease of aperture ratio of the pixel units; and as compared with the eighth embodiment, the ninth embodiment can improve the aperture ratio of the pixel units while ensuring electrical conductivity, but correspondingly may reduce the transmission capacity of the signals. Therefore, those skilled in the art can select specific embodiments to perform during the manufacture process according to actual requirements.

It is understood that the described above are just exemplary implementations and embodiments to explain the principle of the present invention and the invention is not intended to limit thereto. An ordinary person in the art can make various variations and modifications to the present invention without departure from the spirit and the scope of the present invention, and such variations and modifications shall fall in the scope of the present invention.

The present application claims the priority of China patent application No. 201510359215.7 titled "An Array Substrate and a Manufacture Method Thereof, a Display Device" filed on Jun. 25, 2015, which is incorporated herein by reference in its entirely.

What is claimed is:

1. An array substrate, comprising: gate lines and data lines which are crossed to define a plurality of pixel units; and common electrode lines intersected with the data lines, the pixel units being provided with pixel electrodes; wherein,
the common electrode lines are provided with first protrusions electrically connected to the common electrode lines;
the gate lines are provided with first grooves;
the first protrusions are disposed in the first grooves; and
the pixel electrodes are overlapped with corresponding first protrusions.

2. The array substrate according to claim 1, wherein the first protrusions are completely covered by the pixel electrodes.

3. The array substrate according to claim 1, wherein the pixel units further comprise thin film transistors (TFTs), and positions of drain electrodes of the TFTs are corresponding to positions of the first protrusions.

4. The array substrate according to claim 1, wherein the plurality of pixel units comprises first pixel units and second pixel units which are adjacent and are defined by the same data lines;
the common electrode lines in the first pixel units are further provided with second protrusions electrically connected to the common electrode lines;
the gate lines in the first pixel units are further provided with second grooves, the second protrusions are disposed in the second grooves; and
the second protrusions are electrically connected to common electrodes in the second pixel units.

5. The array substrate according to claim 4, further comprising transparent electrical connecting lines, wherein,
the transparent electrical connecting lines are directly contacted with the second protrusions and the common electrodes in the second pixel units; or
the second pixel units are provided with conductive blocks, the conductive blocks are connected to the common electrodes in the second pixel units, and the transparent electrical connecting lines are directly contacted with the second protrusions and the conductive blocks.

6. The array substrate according to claim 5, wherein the gate lines are further provided with third grooves, opening directions of the third grooves are opposite to those of the first grooves and the second grooves, and the conductive blocks are disposed in the third grooves.

7. The array substrate according to claim 1, wherein the common electrode lines and the gate lines are made of a same material.

8. A display device, comprising the array substrate according to claim 1.

9. A manufacture method of an array substrate, comprising:
forming patterns of gate lines and patterns of common electrode lines on a base substrate, wherein the patterns of gate lines are provided with first grooves, the patterns of common electrode lines are provided with first protrusions electrically connected to the patterns of common electrode lines; wherein the first protrusions are disposed in the first grooves;

forming patterns of data lines on the base substrate, wherein the patterns of data lines and the patterns of gate lines are crossed to define a plurality of pixel units; and forming patterns of pixel electrodes in the pixel units, wherein the patterns of pixel electrodes are overlapped with corresponding first protrusions.

10. The manufacture method of the array substrate according to claim 9, wherein forming the patterns of pixel electrodes comprises: forming the patterns of pixel electrodes to completely cover the first protrusions.

11. The manufacture method of the array substrate according to claim 9, wherein prior to forming the patterns of gate lines on the base substrate, the method further comprising:

forming a plurality of patterns of common electrodes on the base substrate by a patterning process, wherein each of the plurality of patterns of common electrodes is corresponding to one of the pixel units, and the plurality of pixel units comprises first pixel units and second pixel units which are adjacent and are defined by the same data lines; and forming the patterns of gate lines and the patterns of common electrode lines comprises:

forming the patterns of gate lines and the patterns of common electrode lines on the substrate having been formed with the patterns of common electrodes corresponding to the first pixel units, wherein the patterns of gate lines are formed with second grooves, the patterns of common electrode lines are formed with second protrusions electrically connected to the patterns of common electrode lines, and the second protrusions are disposed in the second grooves;

sequentially forming patterns of gate insulating layers, patterns of semiconductor active layers, patterns of source electrodes of TFTs, patterns of drain electrodes of the TFTs, patterns of data lines, and patterns of passivation layers by patterning processes on the substrate having been formed with the patterns of gate lines and the patterns of common electrode lines, wherein positions of the patterns of drain electrodes of the TFTs are corresponding to positions of the first protrusions; and electrically connecting the second protrusions to the patterns of common electrodes in the second pixel units.

12. The manufacture method of the array substrate according to claim 11, wherein electrically connecting the second protrusions to the patterns of common electrodes in the second pixel units comprises:

forming first via holes, second via holes and third via holes on the passivation layers, wherein the first via holes are corresponding to positions of the patterns of drain electrodes of the TFTs, the second via holes are corresponding to positions of the second protrusions, and the third via holes are corresponding to positions of the patterns of common electrodes in the second pixel units; and forming patterns of pixel electrodes and patterns of transparent electrical connecting lines by patterning processes on the substrate having been formed with the first via holes, the second via holes and the third via holes, wherein the patterns of pixel electrodes are connected to the patterns of drain electrodes of the TFTs through the first via holes, and the patterns of transparent electrical connecting lines are directly contacted with the second protrusions and the patterns of common electrodes in the second pixel units through the second via holes and the third via holes, respectively.

13. The manufacture method of the array substrate according to claim 11, wherein electrically connecting the second protrusions to the patterns of common electrodes in the second pixel units comprises:

forming conductive blocks in the second pixel units while forming the patterns of gate lines and the patterns of common electrode lines, wherein the conductive blocks are contacted with the common electrodes in the second pixel units;

forming first via holes, second via holes and third via holes in the passivation layers, wherein the first via holes are corresponding to positions of the patterns of drain electrodes of the TFTs, the second via holes are corresponding to positions of the second protrusions, and the third via holes are corresponding to positions of the conductive blocks; and forming the patterns of pixel electrodes and patterns of transparent electrical connecting lines by patterning processes on the substrate having been formed with the first via holes, the second via holes and the third via holes, wherein the patterns of pixel electrodes are connected to the patterns of drain electrodes of the TFTs through the first via holes, and the transparent electrical connecting lines are directly contacted with the second protrusions and the conductive blocks through the second via holes and the third via holes, respectively.

14. The manufacture method of the array substrate according to claim 13, wherein forming the patterns of gate lines on the substrate having been formed with the patterns of common electrodes corresponding to the first pixel units further comprises:

forming third grooves on the patterns of gate lines, wherein opening directions of the third grooves are opposite to those of the first grooves and the second grooves; and forming the conductive blocks comprises: forming the conductive blocks in the third grooves.

15. The array substrate according to claim 2, wherein the plurality of pixel units comprises first pixel units and second pixel units which are adjacent and are defined by the same data lines;

the common electrode lines in the first pixel units are further provided with second protrusions electrically connected to the common electrode lines;

the gate lines in the first pixel units are further provided with second grooves, the second protrusions are disposed in the second grooves; and the second protrusions are electrically connected to the common electrodes in the second pixel units.

16. The array substrate according to claim 3, wherein the plurality of pixel units comprises first pixel units and second pixel units which are adjacent and are defined by the same data lines;

the common electrode lines in the first pixel units are further provided with second protrusions electrically connected to the common electrode lines;

the gate lines in the first pixel units are further provided with second grooves, the second protrusions are disposed in the second grooves; and the second protrusions are electrically connected to the common electrodes in the second pixel units.

17. The array substrate according to claim 15, further comprising transparent electrical connecting lines, wherein,
- the transparent electrical connecting lines are directly contacted with the second protrusions and the common electrodes in the second pixel units; or
- the second pixel units are provided with conductive blocks, the conductive blocks are connected to the common electrodes in the second pixel units, and the transparent electrical connecting lines are directly contacted with the second protrusions and the conductive blocks.

18. The array substrate according to claim 16, further comprising transparent electrical connecting lines, wherein,
- the transparent electrical connecting lines are directly contacted with the second protrusions and the common electrodes in the second pixel units; or
- the second pixel units are provided with conductive blocks, the conductive blocks are connected to the common electrodes in the second pixel units, and the transparent electrical connecting lines are directly contacted with the second protrusions and the conductive blocks.

19. The manufacture method of the array substrate according to claim 10, wherein prior to forming the patterns of gate lines on the base substrate, the method further comprising:
- forming a plurality of patterns of common electrodes on the base substrate by a patterning process, wherein each of the plurality of patterns of common electrodes is corresponding to one of the pixel units, and the plurality of pixel units comprises first pixel units and second pixel units which are adjacent and are defined by the same data lines; and
- forming the patterns of gate lines and the patterns of common electrode lines comprises:
- forming the patterns of gate lines and the patterns of common electrode lines on the substrate having been formed with the patterns of common electrodes corresponding to the first pixel units, wherein the patterns of gate lines are formed with second grooves, the patterns of common electrode lines are formed with second protrusions electrically connected to the patterns of common electrode lines, and the second protrusions are disposed in the second grooves;
- sequentially forming patterns of gate insulating layers, patterns of semiconductor active layers, patterns of source electrodes of TFTs, patterns of drain electrodes of the TFTs, patterns of data lines, and patterns of passivation layers by patterning processes on the substrate having been formed with the patterns of gate lines and the patterns of common electrode lines, wherein positions of the patterns of drain electrodes of the TFTs are corresponding to positions of the first protrusions; and
- electrically connecting the second protrusions to the patterns of common electrodes in the second pixel units.

* * * * *